(12) United States Patent
Chen

(10) Patent No.: US 10,585,361 B2
(45) Date of Patent: Mar. 10, 2020

(54) PROJECTION EXPOSURE APPARATUS AND METHOD

(71) Applicant: SHANGHAI MICRO ELECTRONICS EQUIPMENT (GROUP) CO., LTD., Shanghai (CN)

(72) Inventor: Yuefei Chen, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/089,956

(22) PCT Filed: Mar. 31, 2017

(86) PCT No.: PCT/CN2017/078934
§ 371 (c)(1),
(2) Date: Sep. 28, 2018

(87) PCT Pub. No.: WO2017/167258
PCT Pub. Date: Oct. 5, 2017

(65) Prior Publication Data
US 2019/0137894 A1    May 9, 2019

(30) Foreign Application Priority Data
Mar. 31, 2016  (CN) .......................... 2016 1 0200713

(51) Int. Cl.
*G03F 9/00*     (2006.01)
*G03F 7/20*     (2006.01)
(52) U.S. Cl.
CPC ........ *G03F 9/7026* (2013.01); *G03F 7/70641* (2013.01); *G03F 9/7003* (2013.01);
(Continued)

(58) Field of Classification Search
CPC ............ G03F 7/70475; G03F 7/70641; G03F 9/7065; G03F 9/7026; G03F 9/7023
See application file for complete search history.

(56) References Cited

U.S. PATENT DOCUMENTS

| 5,191,200 A | 3/1993 | Van Der Werf |
| 2009/0015836 A1 | 1/2009 | Maeda |

(Continued)

FOREIGN PATENT DOCUMENTS

| CN | 1459671 A | 12/2003 |
| CN | 1487368 A | 4/2004 |

(Continued)

*Primary Examiner* — Michelle M Iacoletti
(74) *Attorney, Agent, or Firm* — Muncy, Geissler, Olds & Lowe, P.C.

(57) ABSTRACT

A projection exposure apparatus is disclosed, including a focal plane measuring system (8) and an alignment measuring system (9) both disposed between a reticle stage (3) and a substrate stage (4). The alignment measuring system (9) is capable of focusing. The focal plane measuring system (8) measures variation in the surface profile of a substrate (5), and the alignment measuring system (9) effectuates focusing based on data obtained from the measurement performed by the focal plane measuring system (8). After the completion of the focusing, coordinates of various points on the substrate (5) in the alignment measuring system (9) are those of the points that have experienced the profile variation of the substrate (5). A relative positional relationship between the reticle (2) and the substrate (5) that has undergone the profile variation can be computationally derived from the changes in the coordinates of the points, and compensation can be accomplished by moving the substrate stage (4). In this way, even when there are differences between measuring focal planes of the alignment measuring system (9) and the focal plane measuring system (8), the resulting errors can be (Continued)

compensated for through calculation and focusing. An exposure method for a projection apparatus is also disclosed.

19 Claims, 6 Drawing Sheets

(52) U.S. Cl.
CPC .......... *G03F 9/7034* (2013.01); *G03F 9/7065* (2013.01); *G03F 9/7088* (2013.01); *G03F 7/70275* (2013.01)

(56) References Cited

U.S. PATENT DOCUMENTS

| | | | |
|---|---|---|---|
| 2011/0033790 A1* | 2/2011 | Mishima | ................ G03B 27/42 430/30 |
| 2016/0077445 A1 | 3/2016 | Den Boef | |

FOREIGN PATENT DOCUMENTS

| | | |
|---|---|---|
| CN | 102349026 A | 2/2012 |
| CN | 103186060 A | 7/2013 |
| CN | 103246169 A | 8/2013 |
| CN | 104076611 A | 10/2014 |
| CN | 104950587 A | 9/2015 |
| CN | 105005182 A | 10/2015 |
| JP | 2008171960 A | 7/2008 |
| TW | 201316135 A | 4/2013 |
| TW | 201531817 A | 8/2015 |

* cited by examiner

```
┌─────────────────────────────────────────┐
│   Determine a measurement reference zero-plane │
│   of the focal plane measuring elements, reference │
│      measurement focal planes of the alignment │
│   measuring elements and zero-focusing points of │
│            the focusing components      │
└─────────────────────────────────────────┘
                     │
┌─────────────────────────────────────────┐
│      Measure vertical coordinates of alignment │
│    marks and transmit them to the control system │
│       by the focal plane measuring elements and │
│     calculate defocusing amounts for the alignment │
│        measuring elements by the control system │
└─────────────────────────────────────────┘
                     │
┌─────────────────────────────────────────┐
│   Effectuate focusing by the alignment measuring │
│        elements based on the defocusing amounts │
│             calculated by the control system and │
│    computational derive a positional relationship │
│       between the reticle and the substrate by the │
│                  control system         │
└─────────────────────────────────────────┘
                     │
┌─────────────────────────────────────────┐
│    Determine compensation actions to be taken by │
│   the substrate stage and compensation parameters │
│        by the control system based on the positional │
│   relationship between the reticle and the substrate │
└─────────────────────────────────────────┘
```

Fig. 8

PROJECTION EXPOSURE APPARATUS AND METHOD

TECHNICAL FIELD

The present invention relates to the field of semiconductor photolithography and, in particular, to a projection exposure apparatus and method.

BACKGROUND

Thin-film transistors, also known as thin-film field-effect transistors or TFTs, are fabricated using new materials and processes and can be used for construction of large-scale semiconductor integrated circuits (ICs). TFTs are fabricated with various constituent thin films of an intended large-scale semiconductor IC that are deposited on a non-monocrystalline or crystalline substrate such as a glass or plastic substrate by sputtering or chemical deposition. With the development of relevant consumer electronics, there has always been the demand for larger TFT ICs incorporating more TFT units. Lithography in the manufacture of such ICs is seldom accomplishable by using a single illumination system. Steppers employed in IC fabrication and packaging usually have an illumination field of view (FOV) that is not greater than 8 inches. Although scanners use larger fields of view in the scanning direction, they are typically not greater than 10 inches. On the other hand, the manufacture of TFT ICs of the current fifth- or higher-generation requires at least a 17-inch exposure field-of-view. Therefore, the size of an illumination FOV provided by a single exposure lens lags far behind the requirements of large-area lithography. This leads to the development of projection scanners using multiple fields of view that are stitched together, which can reach good trade-offs between device size and yield in the manufacture of large-area devices and have been widely used in the fabrication of large-area semiconductor devices, flat panel displays and thin films.

However, scanning exposure using multiple objectives and multiple fields of view that are stitched together imposes even stricter requirements on the alignment system. Due to the large area to be exposed, accurate alignment requires the use of multiple alignment points. There have been disclosed an alignment measuring system and a focal plane measuring system for use in an exposure apparatus using fields of view that are stitched together. The exposure apparatus essentially includes an illumination light source, a plurality of illumination systems, a reticle, a reticle stage, a plurality of projection optical systems, the alignment measuring system, the focal plane measuring system, a light-sensitive substrate, and a substrate stage. A number of moving mirrors and laser interferometers are provided on opposing sides of the reticle. Reticle inspection systems are provided between sub-patterns on the reticle. Substrate inspection systems and adjustment systems are provided between the projection optical systems. The exposure apparatus further includes a controller. The controller is connected to all the illumination systems, all the projection optical systems, all the alignment measuring systems, all the focal plane measuring systems, all the moving mirrors, all the laser interferometers, all the reticle inspection systems, all the substrate inspection systems, all the adjustment systems, the substrate stage and the reticle stage. The reticle patterns to be exposed are divided into several exposure regions, and an alignment and scanning exposure process is performed in each exposure region. During the alignment and scanning exposure process, the reticle inspection systems, the substrate inspection systems and the adjustment systems arranged on both sides of the sub-pattern being processed are used to detect exposure parameters in order to ensure the exposure of each exposure region to be conducted in an accurate way. Additionally, the controller corrects the exposure parameters for each exposure region in order for higher exposure accuracy to be achieved. However, the conventional exposure apparatus and method suffer from the following problem: as the light-sensitive substrate typically has a certain degree of warpage resulting from heat or uneven forces during semiconductor processing, it is necessary to measure the surface profile of the substrate before the exposure and adjust focal planes based on the surface profile during the exposure, in order to eliminate the impact of the warpage. Unfortunately, in this conventional technique, the measuring focal plane of the alignment measuring systems and the measuring focal plane of the focal plane measuring systems are not the same, and it is necessary to switch between the different focal planes in order to accomplish both focal plane measurement and alignment, which will inevitably introduce errors. Thus, there is a need to invent an exposure apparatus or method capable of reducing errors arising from different focal planes of alignment and focal plane measuring systems during measurement while allowing easy operation, large-FOV lithography, a simple structure and a small footprint.

SUMMARY OF THE INVENTION

In order to solve the above-described problem, the present invention proposes a projection exposure apparatus and method. The apparatus includes a focal plane measuring system and an alignment measuring system both disposed between a reticle stage and a substrate stage, and the alignment measuring system is provided with focusing components. The focal plane measuring system measures variation in the surface profile of a substrate, and the focusing components effectuates focusing of the alignment measuring system based on the substrate profile variation measurement of the focal plane measuring system. After the completion of the focusing, coordinates of various points on the substrate in the alignment measuring system are those of the points that have experienced the profile variation of the substrate. A relative positional relationship between the reticle and the substrate that has undergone the profile variation can be computationally derived from the changes in the coordinates of the points and serve as a basis for compensation. In this way, even when there are differences between measuring focal planes of the alignment measuring system and the focal plane measuring system, the introduced errors can be compensated for through calculation and focusing.

To this end, the present invention provides a projection exposure apparatus, including:

an illumination light source;

an illumination optical system;

a reticle stage, for supporting a reticle;

a projection objective assembly, including a plurality of constituent objectives that together provide a stitched exposure field-of-view;

a substrate stage for supporting a substrate, the substrate including a plurality of exposure regions, each of the plurality of exposure regions having a size matching with the stitched exposure field-of-view; and a control system in signal connection with both of the reticle stage and the substrate stage.

During a scanning exposure process, a light beam emanated from the illumination light source passes through the illumination optical system and is irradiated onto the reticle, thereby transferring a pattern on the reticle onto a corresponding one of the plurality of exposure regions of the substrate through the stitched exposure field-of-view provided by the projection objective assembly, the projection exposure apparatus further including an alignment measuring system and a focal plane measuring system, each electrically connected to the control system, the alignment measuring system including a plurality of alignment measuring elements, the focal plane measuring system including a plurality of focal plane measuring elements, each corresponding to a respective one of the plurality of alignment measuring elements, the alignment measuring system and the focal plane measuring system both disposed between the reticle stage and the substrate stage.

Each of the plurality of alignment measuring elements is capable of focusing, and during alignment of any one of the plurality of exposure regions of the substrate by the alignment measuring system, each of the plurality of alignment measuring elements effectuates focusing and alignment based on focal plane information about the exposure region measured by a corresponding one of the plurality of focal plane measuring elements.

Preferably, each of the alignment measuring elements includes a focusing component.

Preferably, the alignment measuring elements in the alignment measuring system are arranged in a line and each include a first illumination component, a second illumination component, a beam splitting prism, a first imaging component, a second imaging component and a two-dimensional array camera, the first imaging component including the focusing component, and wherein in each of the plurality of alignment measuring elements, illumination light from the illumination light source propagates sequentially through the first illumination component and the second illumination component, is incident on and reflected by the beam splitting prism onto the first imaging component, passes through the first imaging component, reaches an object on the substrate stage and is reflected by the object back to the first imaging component, sequentially passes through the first imaging component, the beam splitting prism and the second imaging component, and reaches the two-dimensional array camera.

Preferably, the focal plane measuring elements in the focal plane measuring system are arranged in a line.

Preferably, the focal plane measuring system measures the focal plane information of the exposure region of the substrate based on a measurement reference zero-plane that serves as a reference, the measurement reference zero-plane being determined based on reference objects on the substrate stage.

Preferably, the reference objects on the substrate stage are provided on a reference scale placed on a top surface of the substrate stage, and wherein the reference scale is positioned beside the substrate and has an elongated shape.

Preferably, the reference objects are implemented as a number of reference marks on the reference scale.

Preferably, the plurality of constituent objectives of the projection objective assembly have a common focal plane.

Preferably, a number of alignment marks are arranged in a line on a surface of the substrate.

Preferably, each of the alignment marks corresponds to only one of the plurality of focal plane measuring elements and only one of the plurality of alignment measuring elements.

Preferably, ones of the alignment marks that are arranged in a row or column have a pitch that is equal to a pitch of ones of the plurality of alignment measuring elements corresponding to the row or column.

Preferably, the illumination light source is a halogen lamp or an LED that produces light in a wavelength band, to which photoresist is not sensitive.

Preferably, the substrate is formed of a glass or silicon-based material.

The present invention also provides an exposure method for a projection exposure apparatus, for irradiating an exposure light beam by an illumination light source and an illumination optical system onto a reticle and thereby transferring a pattern on the reticle onto a substrate through a stitched exposure field-of-view provided by a projection objective assembly. The exposure method further includes the steps of:

1) determining a measurement reference zero-plane for a plurality of focal plane measuring elements and determining reference measurement focal planes for a plurality of alignment measuring elements;

2) obtaining focal plane information through a focal plane measurement performed by the plurality of focal plane measuring elements on the substrate;

3) adjusting measuring focal lengths of the plurality of alignment measuring elements based on the focal plane information obtained by the plurality of focal plane measuring elements in step 2;

4) aligning the reticle and the substrate using the plurality of adjusted alignment measuring elements; and 5) exposing the substrate after the alignment is completed.

Preferably, the focal plane information obtained in step 2 includes data about vertical variation in a surface profile of the substrate.

Preferably, the data about vertical variation in the surface profile of the substrate are derived from deviations of alignment marks on the substrate from the measurement reference zero-plane measured by the focal plane measuring elements.

Preferably, the substrate is placed on a top surface of a reference scale, and when the top surface of the reference scale is located at a common focal plane of the projection objective assembly, the top surface of the reference scale is located at the measurement reference zero-plane of the plurality of focal plane measuring elements.

Preferably, in step 3, the measuring focal lengths of the alignment measuring elements are adjusted based on a relative positional relationship between the reticle and the substrate derived from the focal plane information.

Preferably, determining the reference measurement focal planes for the plurality of alignment measuring elements in step 1 includes determining the reference measurement focal planes for the plurality of alignment measuring elements based on reference marks on the reference scale and setting parameters of focusing components associated with the reference measurement focal planes as zero-focusing reference points.

Preferably, aligning the reticle and the substrate in step 4 includes adjusting the substrate stage to cause rotation, translation or scaling of points oil the substrate oil the substrate stage relative to points on the reticle.

Preferably, the substrate consists of a number of constituent substrates that are stitched together; the reticle consists of a number of constituent reticles that are stitched together and correspond to the respective constituent substrates; each of the constituent substrates, together with a corresponding one of the constituent reticles, constitutes a constituent field of exposure; and exposure is performed using the exposure method as defined in claim 14 for each constituent field of exposure.

According to the present invention, the focal plane measuring system capable of profile variation of the substrate and the alignment measuring system capable of focusing are both disposed between the reticle stage and the substrate stage. In operation, after the focal plane measuring system measures the profile variation, the alignment measuring system effectuates focusing based on focal plane information obtained by the focal plane measuring system. As such, after the completion of the focusing, coordinates of various points on the substrate in the alignment measuring system are those of the points that have experienced the profile variation of the substrate. A relative positional relationship between the reticle and the substrate that has undergone the profile variation can be computationally derived from the changes in the coordinates of the points, and compensation can be accomplished by moving the substrate stage. In this way, even when there are differences between measuring focal planes of the alignment measuring system and the focal plane measuring system, the resulting errors can be compensated for through calculation and focusing.

BRIEF DESCRIPTION OF THE DRAWINGS

FIG. 8 is a flowchart graphically illustrating an exposure method according to Embodiment 1 of the present invention.

In these figures, 1—illumination light source; 2—reticle; 3—reticle stage; 4—substrate stage; 5—substrate; 501—first alignment mark; 502—second alignment mark; 503—third alignment mark; 504—fourth alignment mark; 510—first exposure region; 511—first alignment mark row; 512—second alignment mark row; 513—first alignment mark row; 514—second alignment mark row; 520—second exposure region; 530—third exposure region; 540—fourth exposure region; 6—reference scale; 601—reference mark; 7—projection objective assembly; 8—focal plane measuring system; 801—first focal plane measuring element; 802—second focal plane measuring element; 803—third focal plane measuring element; 804—fourth focal plane measuring element; 9—alignment measuring system; 900—first alignment measuring element array; 91—first illumination component; 92—second illumination component; 93—beam splitting prism; 94—first imaging component; 95—focusing component; 96—second imaging component; 97—two-dimensional array camera; 901—first alignment measuring element; 902—second alignment measuring element; 903—third alignment measuring element; 904—fourth alignment measuring element; 910—second alignment measuring element array.

DETAILED DESCRIPTION OF PREFERRED EMBODIMENTS

The above objects, features and advantages of the present invention will become more apparent and better understood from the following detailed description of specific Embodiments, which is to be read in connection with the accompanying drawings.

Embodiment 1

Figure 1:
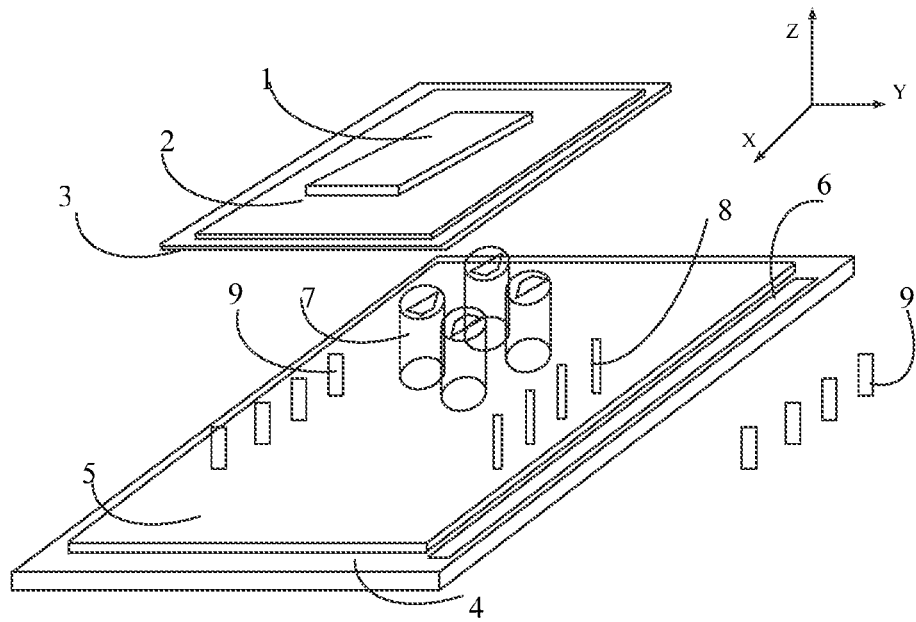
FIG. 1 shows a structural schematic of an exposure apparatus embodying the present invention.
Figure 7:
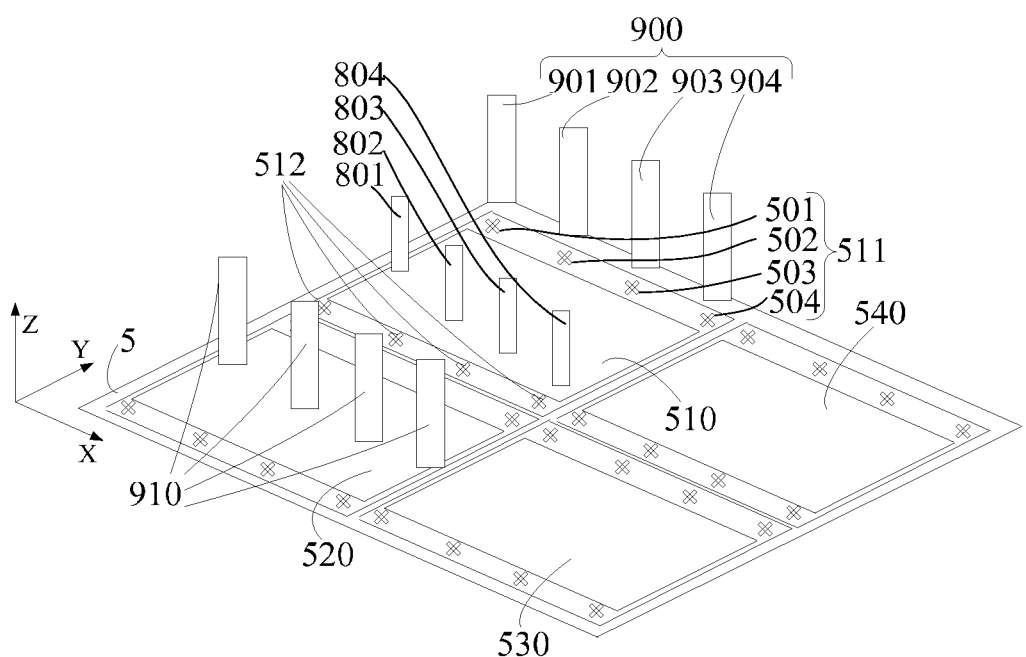
FIG. 7 is a diagram schematically illustrating focusing of the alignment measuring system in accordance with Embodiment 1 of the present invention.
Figure 10:
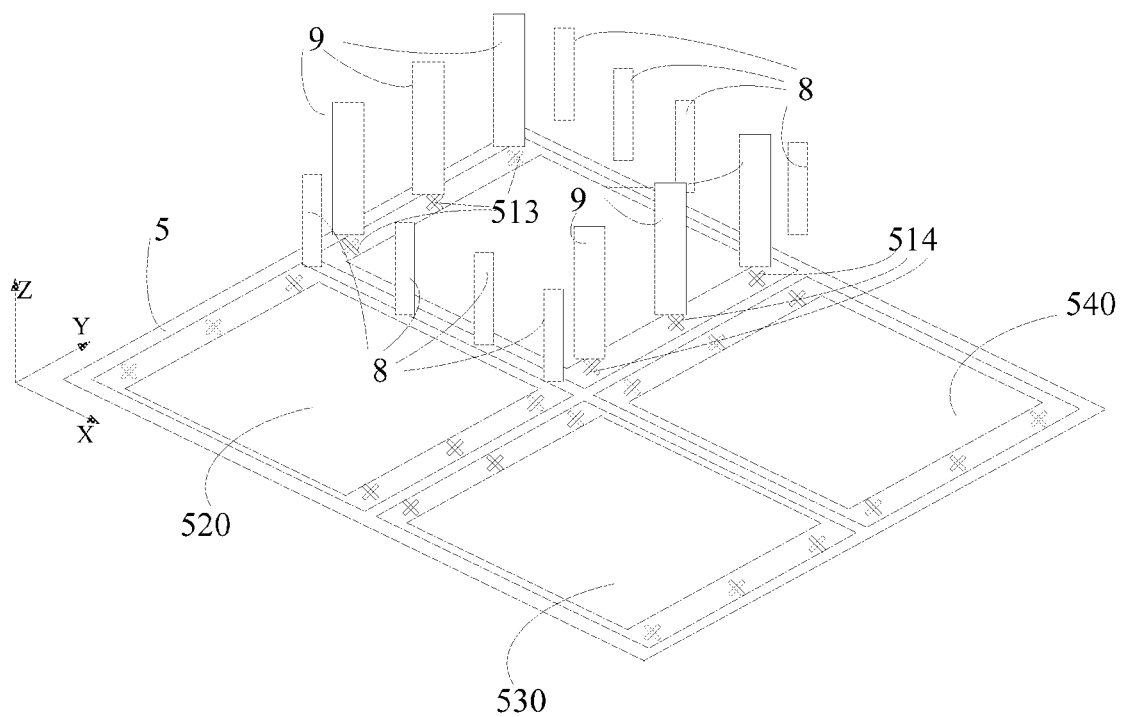
FIG. 10 is a flowchart graphically illustrating an exposure method according to Embodiment 2 of the present invention.

As shown in FIG. 1, the present invention provides a projection exposure apparatus, including an illumination light source 1, a reticle 2, a reticle stage 3, a substrate 5, a substrate stage 4 and a control system (not shown). A reference scale 6 is placed on the surface of the substrate stage 4. The reference scale 6 is typically disposed along a side edge of the substrate stage 4. The substrate 5 is square in shape. The reference scale 6 has a length equal to a side length of the substrate 5. Referring to FIGS. 7 and 10, when the substrate 5 is a large-area substrate, it is divided into a number of exposure regions. For example, the substrate 5 may be divided into four exposure regions, i.e., a first exposure region 510, a second exposure regions 520, a third exposure regions 530 and a fourth exposure regions 540. Accordingly, the reticle 2 may also be correspondingly divided into four sections according to the manner that the substrate 5 is divided. During exposure of the substrate 5, each of the exposure regions is subjected to an alignment-and-exposure cycle. In other words, the four regions are consecutively aligned and exposed. This is because, after undergoing the long, complex preliminary processing, the large-area substrate 5 will have surface irregularities. If the substrate 5 is exposed in a single cycle, some severe ones of the irregularities will inevitably introduce significant errors. For this reason, the substrate is aligned and exposed in the above section-wise manner so that improved exposure accuracy can be achieved for each of the exposure regions.

Preferably, the substrate 5 is made of glass or a silicon-based material and the substrate 5 is placed horizontally. Reference is now made to FIG. 7, in which horizontal directions extending parallel to adjacent sides of the substrate 5 are defined respectively as the X- and Y-directions, and the direction perpendicular to the plane defined by the X- and Y-directions is defined as the Z-direction. Alignment marks are provided on a top surface of the substrate 5, and the number of the alignment marks is two or more. In each of the exposure regions, there are rows of alignment marks. For example, two rows of alignment marks are provided in the first exposure region 510 and are arranged along the X-direction at opposing edges of the first exposure region 510. The two rows of alignment marks include a first alignment mark row 511 and a second alignment mark row 512, each consisting of a number of alignment marks. For example, the first alignment mark row 511 contains four alignment marks, i.e., a first alignment mark 501, a second alignment mark 502, a third alignment mark 503 and a fourth alignment mark 504.

Referring back to FIG. 1, in the projection exposure apparatus, between the reticle stage 3 and the substrate stage 4 are further included a projection objective assembly 7, a focal plane measuring system 8 and an alignment measuring system 9.

The control system is in signal connection with each of the focal plane measuring system 8, the alignment measuring system 9, the reticle stage 3 and the substrate stage 4. During alignment or exposure, information about measurement results of the focal plane measuring system 8, the alignment measuring system 9, the reticle stage 3 and the substrate stage 4 are electrically communicated to the control system. The control system is provided with simulation software for analyzing and processing data and deriving, from the data analysis or processing, commands for controlling the movement of the reticle stage 3 and the substrate stage 4. The reticle stage 3 and the substrate stage 4 move horizontally or vertically in accordance with the commands from the control system.

Preferably, the projection objective assembly 7 consists of a number of constituent objectives that together provide a stitched field of view (FOV). In this Embodiment, the projection objective assembly 7 consists of six constituent objectives that have a common focal plane. During exposure of the substrate 5, the projection objective assembly 7 consisting of the six constituent objectives exposes the exposure regions one by one. That is, subsequent to the exposure of one of the exposure regions, the projection objective assembly 7 moves and handles the next exposure region.

Figure 4:
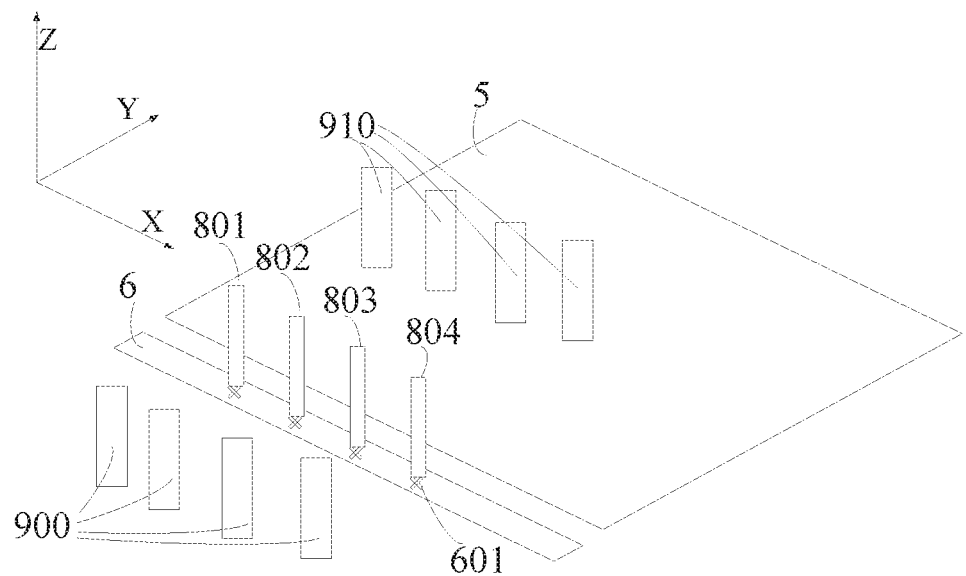
FIG. 4 is a diagram schematically illustrating how a measurement reference zero-plane of the focal plane measuring system is identified in accordance with Embodiment 1 of the present invention.

Referring to FIG. 4, according to the present invention, when all reference marks 601 on the reference scale 6 are positioned at the common focal plane of the projection objective assembly 7, the focal plane measuring system 8 is accordingly determined to be located at a measurement reference zero-plane.

Figure 3:
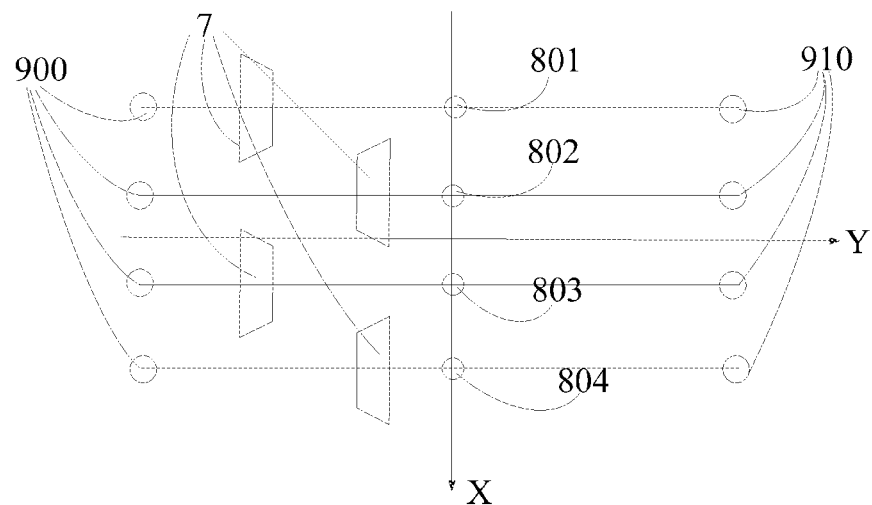
FIG. 3 is a diagram schematically illustrating an arrangement of focal plane and alignment measuring systems according to Embodiment 1 of the present invention.

Referring to FIG. 1, the alignment measuring system 9 typically includes a number of, for example, four alignment measuring elements. Referring to FIGS. 3 and 7, the four alignment measuring elements are arranged along the X-direction. In operation, each of the alignment measuring elements cooperates with a corresponding one of the alignment marks. The four alignment measuring elements include a first alignment measuring element 901, a second alignment measuring element 902, a third alignment measuring element 903 and a fourth alignment measuring element 904, cooperating with the corresponding first alignment mark 501, second alignment mark 502, third alignment mark 503 and fourth alignment mark 504, respectively. In other words, any one of the four alignment marks corresponds to only one of the alignment measuring elements.

Figure 2:
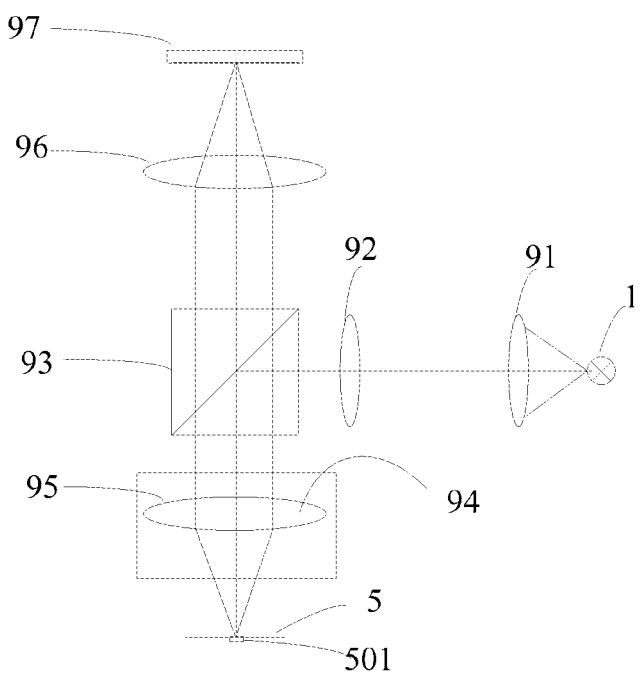
FIG. 2 is a schematic illustration of an alignment measuring element according to Embodiment 1 of the present invention.

Referring to FIG. 2, each of the alignment measuring elements includes a two-dimensional array camera 97, a second imaging component 96, a beam splitting prism 93 and a first imaging component 94. The first imaging component 94 is adapted to direct light onto the reference scale 6 or the substrate 5 and collect light reflected from the reference scale 6 or substrate 5. Each of the alignment measuring elements further includes a first illumination component 91 and a second illumination component 92. The second illumination component 92 is optically coupled to the beam splitting prism 93, and the first illumination component 91 is configured to receive light from the illumination light source 1. In particular, the first imaging component 94 is provided with a focusing component 95. During operation of the alignment measuring element, the focusing component 95 can be adjusted to tune the focal plane of the alignment measuring element.

Figure 5:
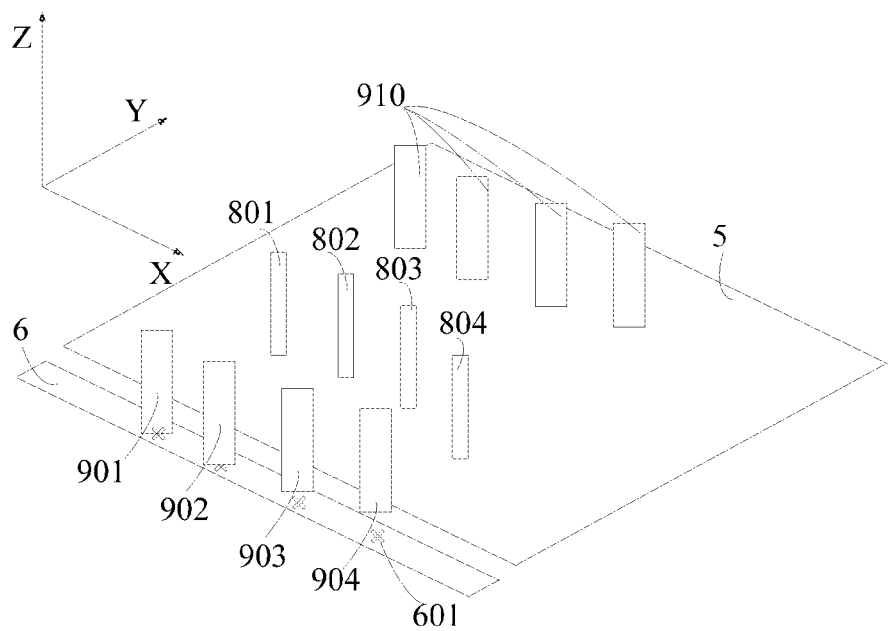
FIG. 5 is a diagram schematically illustrating how reference measurement focal planes of the alignment measuring system are identified in accordance with Embodiment 1 of the present invention.

Referring to FIG. 2, in each of the alignment measuring elements, an optical path can be established in which light from the illumination light source 1 propagates sequentially through the first illumination component 91 and the second illumination component 92 and is then reflected by the beam splitting prism 93 onto the first imaging component 94. After passing through the first imaging component 94, the light is incident on and reflected by the substrate 5 or reference scale 6. The reflect light then sequentially propagates through the first imaging component 94, the beam splitting prism 93 and the second imaging component 96 and finally forms an image on the two-dimensional array camera 97. Referring to FIG. 5, upon the alignment measuring element being aligned with a corresponding reference mark 601 on the reference scale 6, the focusing component 95 is adjusted until a clearest image of the reference mark 601 is captured by the alignment measuring element. At this point, the plane at which the reference mark 601 is located is defined as a reference measurement focal plane for the alignment measuring element, and the point at which the focusing component 95 is located is defined as a zero-focusing point.

Typically, there is a gap between the reference measurement focal plane of the alignment measuring element and the measurement reference zero-plane of the focal plane measuring elements in the focal plane measuring system, and the magnitude of the gap is known. When the focal plane measuring element detects a deviation of a certain point on the substrate from the measurement reference zero-plane, the control system will automatically calculate a defocusing amount of the point from the reference measurement focal plane of the alignment measuring element based on the aforementioned gap and deviation.

Referring to FIG. 3, in this Embodiment, two rows of alignment measuring elements, i.e., a first alignment measuring element array 900 and a second alignment measuring element array 910, are arranged along the X-direction. Between the two alignment measuring element arrays is arranged a row of focal plane measuring elements, i.e., a focal plane measuring element array, also along the X-direction. In other words, the alignment measuring element arrays are parallel to the focal plane measuring element array.

The constituent projection objectives in the projection objective assembly 7 are arranged along the X-direction between the focal plane measuring element array and one of the alignment measuring element arrays. In order for a greater fraction of the exposure region to be covered by the projection objective assembly 7, the projection objectives are staggered from one another along the X-direction.

Referring to FIG. 7, in this Embodiment, in the X-direction, the distance between every two adjacent alignment marks, the distance between every two adjacent alignment measuring elements and the distance between every two adjacent focal plane measuring elements are all the same.

Referring to FIG. 7, in the course of the exposure apparatus scanning in the −Y direction, the focal plane measuring element array measures alignment marks to obtain changes in the surface profile of the substrate 5, the exposure apparatus then advances in the −Y direction so that the alignment marks are encompassed by fields of view of the first alignment measuring element array 900. Subsequently, based on the changes in the surface profile of the substrate 5 measured by the respective focal plane measuring elements, the alignment measuring elements are focused so that clear images of the alignment marks are captured by the respective alignment measuring elements.

In this manner, the focal plane measuring element array and the alignment measuring element array accomplish measurement on the first exposure region 510 and the second exposure region 520 while advancing in the −Y direction. After that, they move in the +X-direction to above the third exposure region 530, and then advance in the +Y direction to start measurement on the third exposure region 530. As two alignment measuring element arrays are provided, after the focal plane measuring element array completes the measurement of the alignment marks for the third exposure regions 530, it is unnecessary to move the first alignment measuring element array 900 along the −Y direction over the alignment marks that have been measured by the focal plane measuring element array. Instead, it is only needed to advance the second alignment measuring element array 910 in the +Y-direction until the aforementioned alignment marks are encompassed by the fields of view of the second alignment measuring element array 910, followed by alignment of these alignment marks using the second alignment measuring element array 910. This can avoid unnecessary movement of the focal plane measuring elements and the alignment measuring elements.

Preferably, the illumination light source 1 is a halogen lamp or LED producing light in a single wavelength band, to which the photoresist is not sensitive.

Referring to FIG. 8, the present invention also provides a projection exposure method using the projection exposure apparatus as defined above. The method includes alignment and exposure actions. In the alignment action, the illumination light source 1 is activated. In the exposure action, the individual exposure regions are exposed in an order that is not limited. In this Embodiment, the first exposure region 510 is first exposed. In the first exposure region 510 of the substrate 5, two rows of alignment marks are arranged along the X-direction, i.e., the first alignment mark row 511 and the second alignment mark row 512. The first alignment mark row 511 contains four alignment marks, i.e., the first alignment mark 501, the second alignment mark 502, the third alignment mark 503 and the fourth alignment mark 504.

Specifically, the method may include the following steps.

In Step 1, the measurement reference zero-plane of the focal plane measuring elements in the focal plane measuring system 8 and the reference measurement focal planes of the individual alignment measuring elements in the alignment measuring system 9 are determined.

The substrate stage 4 is moved so that the reference scale 6 is within a FOV of the focal plane measuring system. When reference marks 601 on the reference scale 6 are all located at the common focal plane of the projection objective assembly 7, the plane at which the reference marks 601 on the reference scale 6 are located is defined as the measurement reference zero-plane for the focal plane measuring system.

The substrate stage 4 is moved so that an alignment measuring element is aligned with a reference mark 601 on the reference scale 6. The focusing component 95 is then adjusted until the reference mark 601 can be most clearly imaged by the alignment measuring element. At this point, the plane at which the reference mark 601 is located as the reference measurement focal plane for the alignment measuring element, and point at which the focusing component 95 is located is defined as the zero-focusing point.

In Step 2: the plurality of focal plane measuring elements measure the substrate to obtain focal plane information.

The focal plane information include data about vertical variations in the surface profile of the substrate, and the measurement reference zero-plane serves as a reference for the vertical variations in the substrate profile. The focal plane measuring elements obtain the data about vertical variations in the substrate profile by measuring the alignment marks on the substrate 5.

Specifically, the substrate stage 4 is moved so that the first exposure region 510 is horizontally advanced into the FOV of the focal plane measuring system 8. In other words, each of the alignment marks in the first exposure region 510 can be imaged by a corresponding one of the focal plane measuring elements. At this point, a vertical coordinate (Z-direction coordinate) of each alignment mark is calculated. In the exposure apparatus, a horizontal plane is defined by the X- and Y-axes, while a vertical direction, i.e., a Z-direction, crosses the horizontal plane at right angles. With this in mind, a certain point on the substrate 5 can be represented by a horizontal coordinate (x, y), a three-dimensional coordinate (x, y, z) or a vertical coordinate z. After that, the measured vertical coordinates of the alignment marks are transmitted by the focal plane measuring elements to the control system. The control system then calculates differences of the vertical coordinates from those if the variation had not occurred (i.e., deviations of the alignment marks from the measurement reference zero-plane of the focal plane measuring elements) as well as defocusing amounts for the alignment measuring elements based on the differences between the measurement reference zero-plane of the focal plane measuring elements and the reference measurement focal planes of the alignment measuring elements.

In Step 3, focal lengths of the alignment measuring elements are adjusted based on the defocusing amounts for the alignment measuring elements calculated in step 2.

Specifically, referring to FIG. 7, the first alignment measuring element array 900 is moved to above the first alignment mark row 511, and the alignment measuring elements are focused based on the defocusing amounts for the alignment measuring elements calculated by the control system in step 2 so that the alignment marks can be clearly imaged by the alignment measuring elements.

In Step 4, the focused alignment measuring elements measure horizontal positions of the respective alignment marks, followed by a calculation of relative positional relationships between the substrate and the reticle.

First, the focused alignment measuring elements measure the horizontal positions of the respective alignment marks, i.e., horizontal coordinates (x, y) of the alignment marks.

Figure 6:
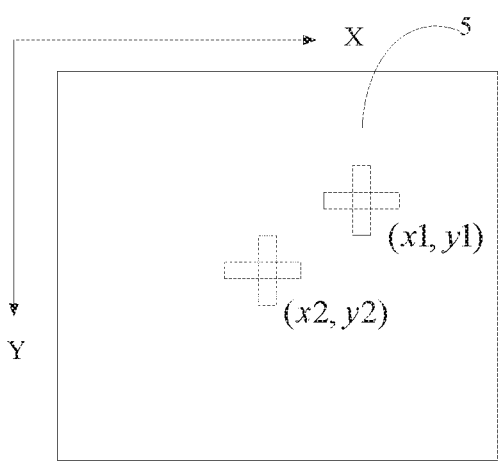
FIG. 6 is a diagram schematically illustrating how the coordinate of a point changes due to variation in the surface profile of a substrate in accordance with Embodiment 1 of the present invention.

Subsequently, based on the horizontal coordinates (x, y) of the alignment marks measured by the alignment measuring elements and the vertical coordinates z of the alignment marks calculated by the focal plane measuring elements in step 2, the control system calculates changes in the image of the reticle 2 projected on the substrate 5 at related points resulting from the profile variation. In this way, relative positional relationships between the sections of the reticle 2 and the respective corresponding exposure regions of the substrate 5 can be derived. These relative positional relationships reflect rotation, translation or scaling of various points on the substrate 5 with respect to corresponding points on the reticle 2. For example, referring to FIG. 6, if the profile variation of the substrate 5 had not occurred, the horizontal coordinate of a projection of a point on the reticle 2 on the substrate 5 would have been (x1, y1). However, if the profile variation of the substrate 5 had occurred, the horizontal coordinate of an actual projection of the point on the reticle 2 on the substrate 5 would be (x2, y2).

Afterwards, based on the calculated relative positional relationships between the sections of the reticle 2 and the corresponding exposure regions of the substrate 5, the control system derives actions to be taken by the substrate stage 4 for compensation as well as relevant parameters. The derivation can be accomplished using a conventional method.

In Step 5, the current exposure region (here, the first exposure region 510) is exposed.

In Step 6, Steps 1 to 5 are repeated sequentially on the second exposure region 520, the third exposure region 530 and the fourth exposure region 540 so that the exposure of the whole substrate 5 is completed.

Embodiment 2

Figure 9:
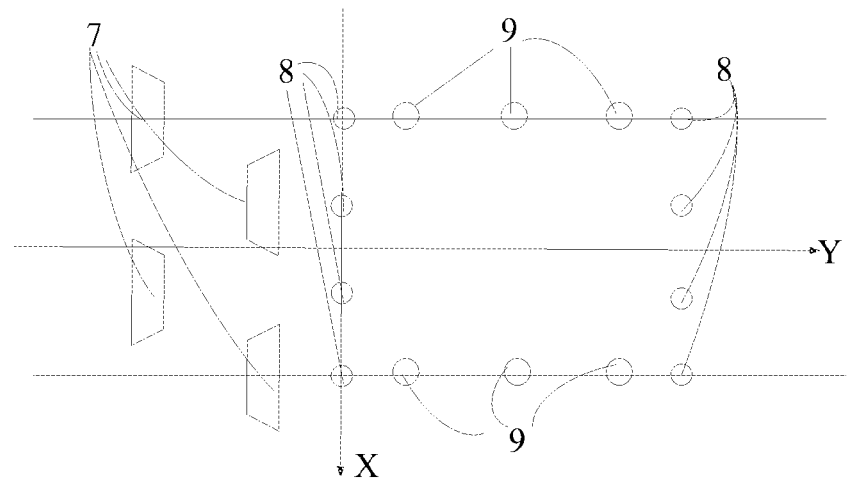
FIG. 9 is a diagram schematically illustrating focusing of an alignment measuring system in accordance with Embodiment 2 of the present invention.

Referring to FIG. 9, this Embodiment differs from Embodiment 1 in that the arrangement direction of the focal plane measuring element arrays is orthogonal to the arrangement direction of the alignment measuring element arrays. Specifically, two alignment measuring element arrays are arranged along the Y-direction and two focal plane measuring element arrays along the X-direction in such a manner that a rectangle is defined with four corners each occupied by one of the focal plane measuring elements in the focal plane measuring element arrays.

Accordingly, referring to FIG. 10, the alignment marks on the substrate 5 are arranged in a similar fashion. In the first exposure region 510, two rows of alignment marks are arranged along the Y-direction, i.e., a first alignment mark row 513 and a second alignment mark row 514. The first alignment mark row 513 contains three alignment marks. The second alignment mark row 514 also contains three alignment marks.

Similarly, the focal plane measuring elements and the alignment measuring elements first advance in the −Y direction, followed by the focal plane measuring elements at the four corners of the rectangle measuring alignment marks in the first and second alignment mark rows 513, 514 and the remaining focal plane measuring elements optionally measuring profile variation of the substrate 5 at locations out of the alignment marks.

After the measurement of the first and second alignment mark rows 513, 514 by the focal plane measuring elements at the four corners of the rectangle is completed, the focal plane measuring elements and the alignment measuring elements further advance in the −Y direction, followed by alignment of the alignment marks in the first and second alignment mark rows 513, 514 by the two alignment measuring element arrays. Specifically, the first and second alignment mark rows 513, 514 are caused to be within fields of view of the two alignment measuring element arrays, and focal length adjustments are effected in the alignment measuring element arrays based on the focal plane information obtained by the focal plane measuring elements. In this way, alignment and exposure is accomplished on the first exposure region 510. The above process is then repeated sequentially on the second exposure region 520, the third exposure region 530 and the fourth exposure region 540 for their alignment and exposure.

While the present invention has been described above with reference to the foregoing embodiments, it is not limited to these embodiments disclosed. It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A projection exposure apparatus, comprising:
an illumination light source;
an illumination optical system;
a reticle stage, for supporting a reticle;
a projection objective assembly, comprising a plurality of constituent objectives that together provide a stitched exposure field-of-view;
a substrate stage for supporting a substrate, the substrate comprising a plurality of exposure regions, each of the plurality of exposure regions having a size matching with the stitched exposure field-of-view; and
a control system in signal connection with both of the reticle stage and the substrate stage,
wherein during a scanning exposure process, a light beam emanated from the illumination light source passes through the illumination optical system and is irradiated onto the reticle, thereby transferring a pattern on the reticle onto a corresponding one of the plurality of exposure regions of the substrate through the stitched exposure field-of-view provided by the projection objective assembly,
the projection exposure apparatus further comprising an alignment measuring system and a focal plane measuring system, each electrically connected to the control system, the alignment measuring system comprising a plurality of alignment measuring elements, the focal plane measuring system comprising a plurality of focal plane measuring elements, each corresponding to a respective one of the plurality of alignment measuring elements, the alignment measuring system and the focal plane measuring system both disposed between the reticle stage and the substrate stage,
wherein each of the plurality of alignment measuring elements is capable of focusing, and during alignment of any one of the plurality of exposure regions of the substrate by the alignment measuring system, each of the plurality of alignment measuring elements effectuates focusing and alignment based on data about vertical variation in a surface profile of the substrate about the exposure region measured by a corresponding one of the plurality of focal plane measuring elements, and measuring focal lengths of the plurality of alignment measuring elements are adjustable based on the data about vertical variation in the surface profile of the substrate,
wherein each of the plurality of alignment measuring elements comprises a focusing component which can be adjusted to tune a focal plane of the corresponding alignment measuring element.

2. The projection exposure apparatus of claim 1, wherein the plurality of alignment measuring elements of the alignment measuring system are arranged in a line and each comprise a first illumination component, a second illumination component, a beam splitting prism, a first imaging component, a second imaging component and a two-dimensional array camera, the first imaging component comprising the focusing component, and wherein in each of the plurality of alignment measuring elements, illumination light from the illumination light source propagates sequentially through the first illumination component and the second illumination component, is incident on and reflected by the beam splitting prism onto the first imaging component, passes through the first imaging component, reaches an object on the substrate stage and is reflected by the object back to the first imaging component, sequentially passes through the first imaging component, the beam splitting prism and the second imaging component, and reaches the two-dimensional array camera.

3. The projection exposure apparatus of claim 1, wherein the plurality of focal plane measuring elements of the focal plane measuring system are arranged in a line.

4. The projection exposure apparatus of claim 1, wherein the focal plane measuring system measures the data about vertical variation in the surface profile of the substrate of the exposure region of the substrate based on a measurement reference zero-plane that serves as a reference, the measurement reference zero-plane being determined based on reference objects on the substrate stage.

5. The projection exposure apparatus of claim 4, wherein the reference objects on the substrate stage are provided on a reference scale placed on a top surface of the substrate stage, and wherein the reference scale is positioned beside the substrate and has an elongated shape.

6. The projection exposure apparatus of claim 5, wherein the reference objects are implemented as a number of reference marks on the reference scale.

7. The projection exposure apparatus of claim 1, wherein the plurality of constituent objectives of the projection objective assembly have a common focal plane.

8. The projection exposure apparatus of claim 1, wherein a number of alignment marks are arranged in a line on a surface of the substrate.

9. The projection exposure apparatus of claim 8, wherein each of the alignment marks corresponds to only one of the plurality of focal plane measuring elements and only one of the plurality of alignment measuring elements.

10. The projection exposure apparatus of claim 8, wherein ones of the alignment marks that are arranged in a row or column have a pitch that is equal to a pitch of ones of the plurality of alignment measuring elements corresponding to the row or column.

11. The projection exposure apparatus of claim 1, wherein the illumination light source is a halogen lamp or an LED that produces light in a wavelength band, to which photoresist is not sensitive.

12. The projection exposure apparatus of claim 1, wherein the substrate is formed of a glass or silicon-based material.

13. An exposure method for a projection exposure apparatus, for irradiating an exposure light beam by an illumination light source and an illumination optical system onto a reticle and thereby transferring a pattern on the reticle onto a substrate through a stitched exposure field-of-view provided by a projection objective assembly, the exposure method further comprising the steps of:

1) determining a measurement reference zero-plane for a plurality of focal plane measuring elements and determining reference measurement focal planes for a plurality of alignment measuring elements;

2) obtaining data about vertical variation in a surface profile of the substrate through a focal plane measurement performed by the plurality of focal plane measuring elements on the substrate;

3) adjusting measuring focal lengths of the plurality of alignment measuring elements based on the data about vertical variation in the surface profile of the substrate obtained by the plurality of focal plane measuring elements in step 2;

4) aligning the reticle and the substrate using the plurality of adjusted alignment measuring elements; and 5) exposing the substrate after the alignment is completed, wherein each of the plurality of alignment measuring elements comprises a focusing component which can be adjusted to tune a focal plane of the corresponding alignment measuring element.

14. The exposure method of claim 13, wherein the data about vertical variation in the surface profile of the substrate are derived from deviations of alignment marks on the substrate from the measurement reference zero-plane measured by the plurality of focal plane measuring elements.

15. The exposure method of claim 13, wherein the substrate is placed on a top surface of a reference scale, and when the top surface of the reference scale is located at a common focal plane of the projection objective assembly, the top surface of the reference scale is located at the measurement reference zero-plane of the plurality of focal plane measuring elements.

16. The exposure method of claim 15, wherein determining the reference measurement focal planes for the plurality of alignment measuring elements in step 1 comprises determining the reference measurement focal planes for the plurality of alignment measuring elements based on reference marks on the reference scale and setting parameters of the focusing components associated with the reference measurement focal planes as zero-focusing reference points.

17. The exposure method of claim 13, wherein in step 3, the measuring focal lengths of the plurality of alignment measuring elements are adjusted based on a relative positional relationship between the reticle and the substrate derived from the data about vertical variation in the surface profile of the substrate.

18. The exposure method of claim 13, wherein aligning the reticle and the substrate in step 4 comprises adjusting the substrate stage to cause rotation, translation or scaling of points on the substrate on the substrate stage relative to points on the reticle.

19. The exposure method of claim 13, wherein: the substrate consists of a number of constituent substrates; the reticle consists of a number of constituent reticles and correspond to the respective constituent substrates; each of the constituent substrates, together with a corresponding one of the constituent reticles, constitutes a constituent field of exposure; and exposure is performed using the exposure method as defined in claim 14 for each constituent field of exposure.

* * * * *